United States Patent [19]
Cohn

[11] Patent Number: 5,102,829
[45] Date of Patent: Apr. 7, 1992

[54] PLASTIC PIN GRID ARRAY PACKAGE

[75] Inventor: Charles Cohn, Wayne, N.J.

[73] Assignee: AT&T Bell Laboratories, Murray Hill, N.J.

[21] Appl. No.: 733,542

[22] Filed: Jul. 22, 1991

[51] Int. Cl.⁵ .......................................... H01L 21/60
[52] U.S. Cl. .................................. 437/217; 437/209; 437/211; 437/215; 437/218; 357/70; 357/80
[58] Field of Search ............... 437/217, 215, 209, 211, 437/218; 357/70, 80, 81

[56] References Cited

U.S. PATENT DOCUMENTS

| | | | |
|---|---|---|---|
| 4,618,739 | 10/1986 | Theobald . | |
| 4,620,215 | 10/1986 | Lee | 357/81 |
| 4,688,152 | 8/1987 | Chia | 437/211 |
| 4,742,024 | 5/1988 | Sugimoto et al. | 357/80 |
| 4,791,075 | 12/1988 | Lin | 437/209 |
| 4,822,550 | 4/1989 | Komathu | 437/211 |
| 4,916,522 | 4/1990 | Cohn . | |

FOREIGN PATENT DOCUMENTS

| | | | |
|---|---|---|---|
| 56-37720 | 9/1981 | Japan . | |
| 57-141934 | 9/1982 | Japan | 437/217 |
| 2-143433 | 6/1990 | Japan | 437/209 |

OTHER PUBLICATIONS

C. Cohn et al., "Plastic Pin Grid Array Packages—The AT&T Experience" Proceedings of the International Electronics Packaging Conference, Marlboro, Massachusetts, Sep. 10-12, 1990, pp. 882-893.

Primary Examiner—Brian E. Hearn
Assistant Examiner—Kevin M. Picardat
Attorney, Agent, or Firm—O. E. Alber

[57] ABSTRACT

This invention is a simple and effective process of producing a plastic pin grid array package having an encapsulated device and a heat sink forming a unitary component of a main planar body of the package. The process includes fabrication of a laminated planar main body having outer plastic sheets provided with metallizations, a metal sheet of high thermal conductivity, and plastic sheets positioned intermediate the outer plastic sheets and the metal sheet, the metal sheet having clearance holes filled with plugs of the material of the intermediate plastic sheets, a plurality of plated-through holes (PTHs) formed in the main body and terminal pins secured in the PTHs. Some of the PTHs contacting the metal sheet and some passing through the plugs in the clearance holes out of contact with the metal sheet. The device, such as an integrated circuit chip, mounted in a recessed cavity in the main body, is in contact with the metal heat-sink. In this manner heat is conducted away from the device by the heat sink and dissipated through the back of the package and those of the terminal pins which are in PTHs contacting the heat sink.

12 Claims, 4 Drawing Sheets

PLASTIC PIN GRID ARRAY PACKAGE

TECHNICAL FIELD

This invention concerns the fabrication of a Plastic Pin Grid Array (PPGA) Package provided with a heat-dissipating member.

Background of the Invention

Integrated circuit chips are mounted in plastic packages for a lower cost of packaging as compared with ceramic packages. The plastic packages provide several important advantages for the chip operation as compared with ceramic packages, namely higher current carrying capacity, lower dielectric constant for shorter operational delay times, along with reduced inductance and capacitance; however, the generally inferior heat dissipation experienced with plastic packages remains a problem. This problem is often aggravated by encapsulation techniques in which the chip is mounted in the plastic package whereby additional plastic material is molded around the mounted chip. The need for efficient removal of heat from the packages becomes more pronounced with the advent of more sophisticated integrated chips having a higher degree of integration and higher power densities. Rather elaborate heat sink methods are now commonly used in plastic packages as a means to increase heat dissipation and, thus, to maintain the temperature of the integrated circuit chip within its designed operational limits. An example of a plastic pin grid array integrated circuit package with a heat sink is disclosed in U.S. Pat. No. 4,618,739 issued on Oct. 21, 1986 to Paul R. Theobald. However, the package is fabricated of several separated formed subunits which require numerous processing steps to prepare and assemble into a unitary package.

Accordingly, it is desirable to provide a plastic pin grid array (PPGA) package which will remove effectively the heat from the encapsulated device and which is simple to construct and produce on a mass production basis while avoiding any need for complex heat sinking techniques during the packaging process.

Summary of the Invention

This problem has been effectively mitigated by fabrication of a laminated planar main body including outer plastic sheets provided with metallizations, a metal sheet of high thermal conductivity and plastic sheets positioned intermediate the outer plastic sheets and the metal sheet, the metal sheet having clearance holes filled with plugs of the material of the intermediate plastic sheets, formation of a plurality of plated through holes (PTHs) in the main body including (PTHs) through the plugs in the clearance holes, formation of a recess in the main body with a portion of the metal sheet acting as a base of the recess, positioning of terminal pins in the PTHs, attachment of an encapsulant retaining dam about the recess, attachment of an electronic device, such as an IC chip, in the recess in contact with the metal sheet, conductive connection of the device to conductors and pins, and then plastic encapsulation of the device for mechanical and environmental protection. The metal sheet acts as a heat sink with heat being removed through the back of the package and through the pins which are in contact with the metal sheet. The process is a simple and effective way of providing a heat sink and for effectively removing the heat from the device via direct contact of the device with the metal heat sink and via certain PTHs and pins of the device. The laminated planar body is suitable for mass production.

DETAILED DESCRIPTION

This invention is a process for fabricating Plastic Pin Grid Array (PPGA) packages provided with an efficient removal of heat from an encapsulated IC chip and suitable for mass production. The heat is transferred from the chip to a metal heat sink, unitarily formed into the PWB, and may be removed from the inside of the package by means of pins contacting the heat sink and/or dissipated through the back of the package. The PPGA package provides protection of an integrated circuit (IC) device (a chip or a die) from hostile environments and handling, while simultaneously providing interconnection of the device to a printed wiring board (PWB) and effective heat dissipation.

Figure 1:
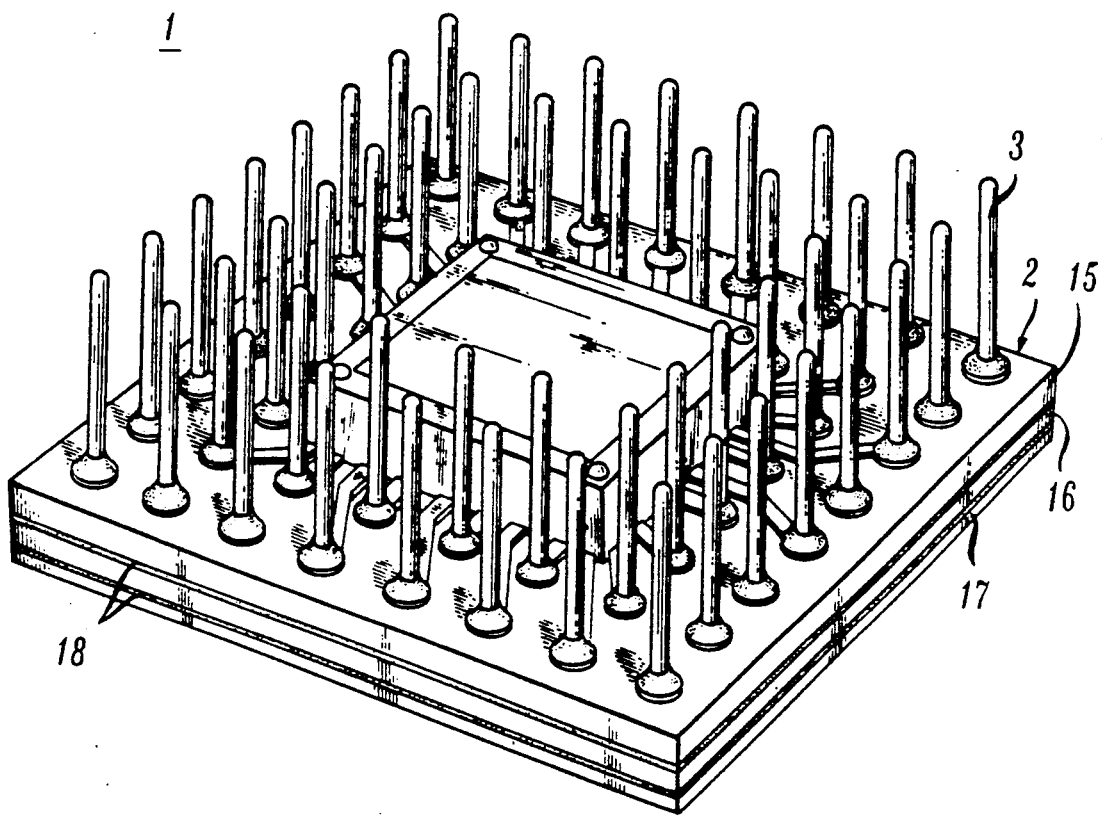
FIG. 1 is a perspective view depicting a plastic pin grid array integrated circuit chip carrier package with a heat-sink of the present invention.
Figure 2:
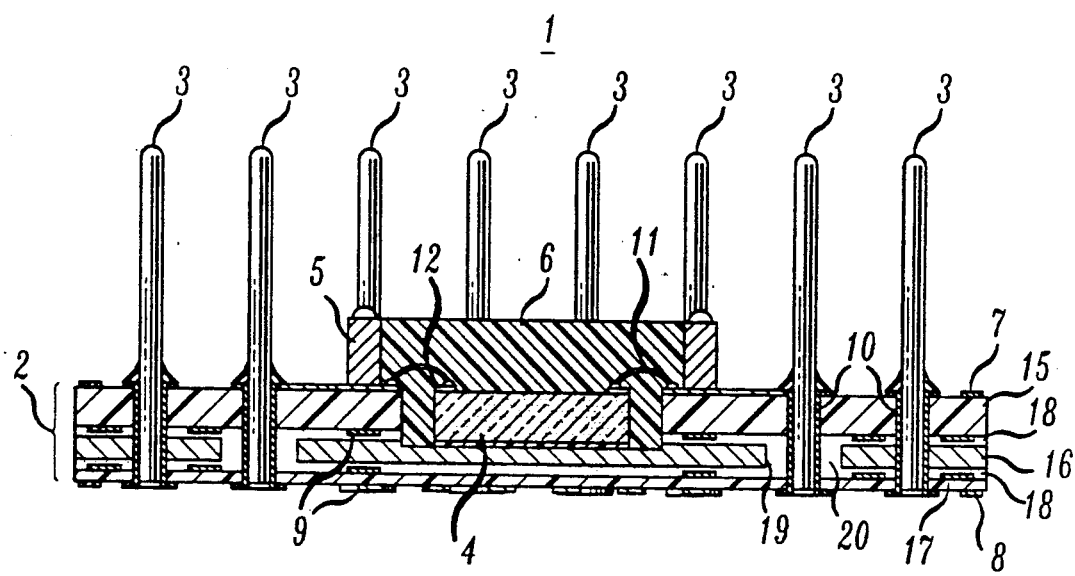
FIG. 2 is a schematic representation of the FIG. 1 package shown in cross-section.
Figure 7:
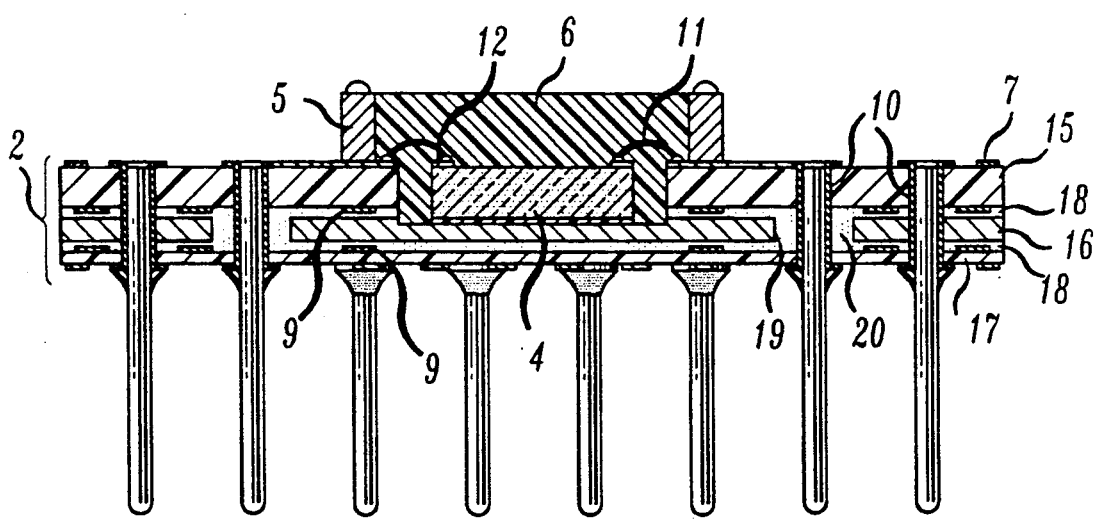
FIG. 7 is a schematic variant of FIG. 2 package, with pins projecting in a downward facing direction, opposite to that of FIG. 2.

FIGs. 1 and 2 are, respectively, perspective and cross-sectional schematic representation of an exemplary PPGA package, generally designated as 1. For reasons of clarity the elements of the package are not drawn to scale. PPGA package 1 includes a planar main body of a printed wiring board (PWB), generally designated as 2, metallic pins 3, an IC device 4, an encapsulant retaining dam, 5, and a synthetic organic polymer (hereinafter referred to as "plastic"), 6, encapsulating the device. A plurality of metallized conductors, 7, 8 and 9 are arranged on top, bottom and within the PWB, respectively. A plurality of plated-through holes (PTHs), 10, are provided transversely of the PWB for receiving pins 3 and for interconnecting various conductor levels of the PWB. The pins may project above the surface of the PWB containing the IC device or, alternatively, from the bottom of the PWB (as shown in FIG. 7). Wires, 11, interconnect pads, 12, on the device with conductors 7 on the PWB.

In an exemplary embodiment, PWB 2 includes a plastic top body 15, a metal heat-sink 16, a plastic bottom body, 17, and plastic bonding sheets 18. Preformed clearance holes 19 are provided at selected positions in the heat sink 16 to permit passage of pins through the PWB without making an electrical contact with the heat sink. The clearance holes are filled with plugs, 20, of the same material as the bonding layers. No clearance holes are provided at those sites where electrical contact between the pins and the heat sink is required.

The process of producing a PWB in the form ready for assembly with pins 3 and device 4 may be generally described as follows.

Figure 3:
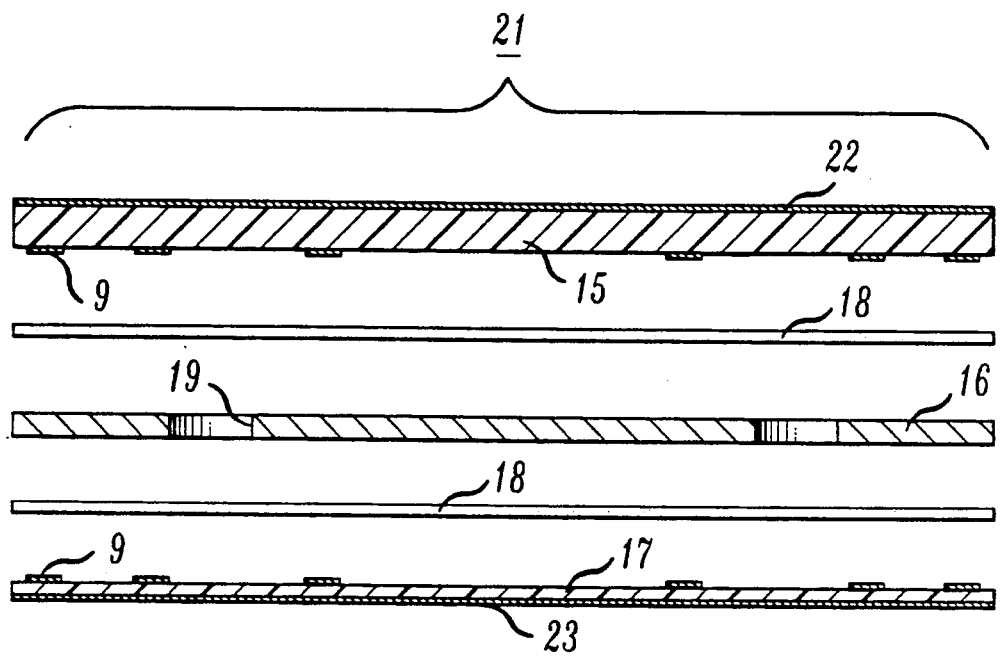
FIG. 3 is an exploded cross-sectional view depicting components of a preassembly of a main body of the package, including a heat sink component prior to a laminating step.

Sheets of materials, to be bonded into a main planar body of the PWB containing a heat-sink, are assembled into a preassembly 21 as is shown in an exploded view depicted in FIG. 3. The sheets may be large enough to produce only a single package or may be of such expanse as to be useful in preparation of several packages in a single operation. In the latter instance, the size of the sheets may be limited only by the size of a laminating press in which a stack of sheets forming the PWB is to be laminated. Alternatively, the sheet preassembly may be in the form of elongated strips and may advance through the press in a reel-to-reel manner, so that preassemblies may be laminated in the press in succession.

Preassembly 21 includes top and bottom plastic sheets 15 and 17 of a "C"-stage PWB material, a sheet of high heat conductivity metal 16 located between the outer sheets, and bonding sheets 18 of a "B"-stage (also called "prepreg") material placed intermediate the metal sheet and the outer sheets. The metal sheet has preformed "clearance" holes 19. The clearance holes are provided so that a PTH passing through the clearance hole, and thus a pin in that PTH, is electrically isolated from the metal sheet. Preferably at this stage sheets 15 and 17 have continuous outer metallizations 22 and 23, respectively, and inner patterned metallizations 9. The preassembly is then placed into a laminating press (not shown) wherein it is subjected to pressure and heat. The pressure and temperature are selected to be sufficient to bond the component sheets together and to force some of the prepreg material into clearance holes 19 in the metal sheet forming plugs, 20. Simultaneous application of heat and pressure completes the curing of the prepreg material resulting in a PWB blank shown in FIG. 4. The temperature and duration of the application of heat are selected to cure the bonding material without causing damage to the PWB.

Figure 5:
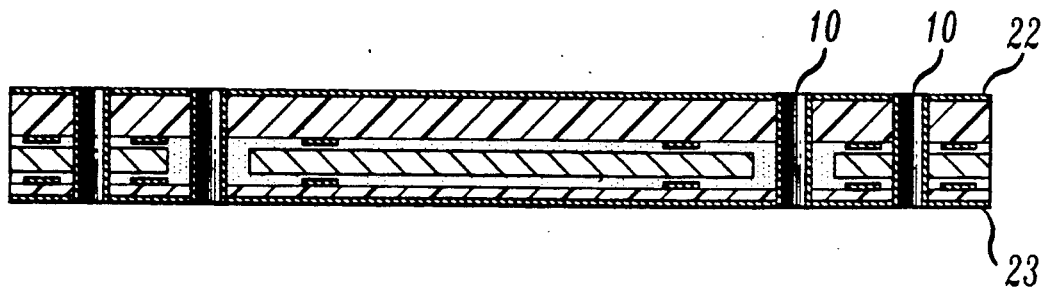
FIG. 5 depicts the main body shown in FIG. 4, provided with plated through holes (PTHs)
Figure 6:
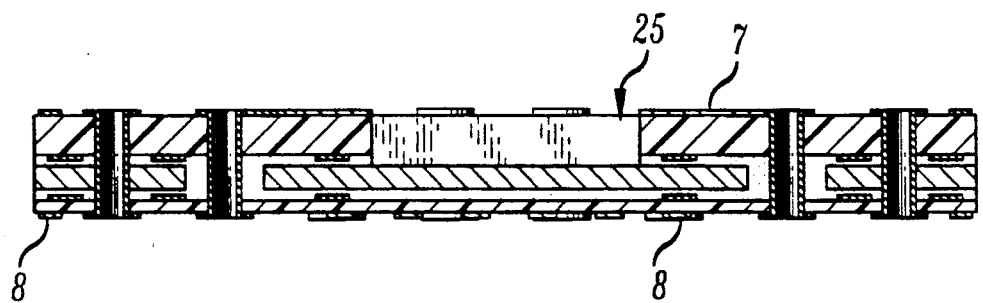
FIG. 6 depicts the main body of FIG. 5, provided with a recess cavity for an IC chip, prior to the assembly of the pins and the encapsulant retaining dam into the main body, followed by the assembly of the chip.

The so-formed PWB blank is then subjected to the formation of PTHs 10. This is accomplished by forming, e.g. by drilling or punching, holes through the PWB, including holes through plugs 20 in heat-sink 16, and plating the walls of the holes so as to form the PTHs (FIG. 5). This is followed by the formation, e.g. by etching, of conductive patterns of a desired configuration in the metallizations 22 and 23. Thereafter, a centrally located recess cavity, 25, is formed in upper sheet 15 of the PWB and in adjacent bonding sheet 18 down to or even below an upper surface of metal sheet forming heat-sink 16 of the PWB. The size of the recess cavity is selected to be greater than the outer parameter of device 4 (an IC-chip or die) to be mounted on the PWB. The opening is small enough to restrict wires 11, especially at corner connections, to lengths at which the wires shall have no tendency to collapse. The PWB ready for pin insertion into the PTHs, mounting of the device thereon and its encapsulation, is shown in FIG. 6 of the drawings.

The fabrication of the PPGA packages may be described in greater detail as follows:

Prior to the preassembly of individual sheets 15, 16, 17 and 18, clearance holes 19 are formed in metal sheet 16 which is intended to be used as a heat-sink. The clearance holes are large enough to prevent electrical connection, where designated, between the metal sheet and any plated-through holes or pins. The heat sink is of a high heat-conducting material. Typically the heat-sink is of copper whose thickness may range from 0.010 to 0.030 inches (0.025 to 0.076 cm.).

Plastic sheets 15 and 17, metal sheet 16, and bonding sheets 18 are arranged into preassembly 21 shown in an exploded view in FIG. 3. Sheets 15 and 17 are of a typical "C"-stage PWB material, each provided on the outer surface with a metallization, 22 and 23, respectively. Sheets 15 and 17 are also provided on their inner sides with patterned metallizations 9. Typically, the C-stage material is of a high temperature ($T_g > 180°$ C.) glass fiber reinforced epoxy laminate.

Bonding sheets 18 placed between the heat sink 16 and the C-stage material sheets 15 and 17, are of B-stage or "prepreg" material. The B-stage is an intermediate stage in the reaction of a thermosetting resin in which the material softens when subjected to pressure and heat but does not entirely fuse. The B-stage material typically is of the same material as the C-stage material, but only in a partially cured state.

Figure 4:
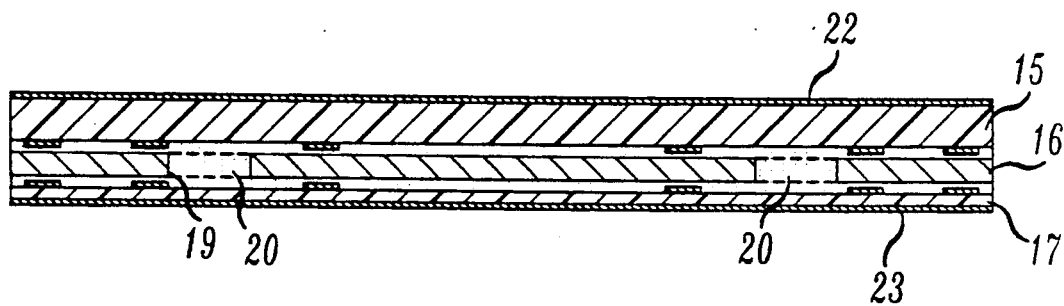
FIG. 4 depicts in cross section the components of the preassembly after being laminated into the main body.

Preassembly 21 of sheets 15, 16, 17 and 18 is placed into a laminating press (not shown) wherein the preassembly is subjected to pressure and heat to laminate individual sheets of the preassembly into a single PWB laminate shown in FIG. 4. In this step, the pressure and heat cause the B-stage bonding sheets 18 to soften and to flow filling the preformed clearance holes 19 in the heat sink with plastic plugs 20. The thickness of bonding sheets 18 prior to the curing step is preselected such as to fill the clearance holes and still to electrically isolate metallizations 9 on sheets 15 and 17 from the heat sink 16.

After the laminating step, PTHs 10 are formed in the PWB laminate. First, apertures are formed in the PWB laminate, typically by drilling or punching. Then, walls of the holes are plated-through in a known manner, such as by first producing a thin Cu coating by electroless deposition followed by electroplating a thicker Cu coating. PTHs 10 plated on the walls of holes passing through insulating plugs 20 do not form an electrical contact with heat sink 16. Such PTHs may be used for interconnection between the device and other metallization levels. The remaining PTHs, which are in electrical contact with the heat sink, may be used as ground connections between the device and the pins and for removal of heat via respective pins from the heat sink. In the latter instance, such PTHs need not be connected to any of metallization conductors on the surface of the PWB. The laminated PWB with PTHs formed therein, is shown in FIG. 5 of the drawings.

After the formation of PTHs 10, certain areas of metallizations 22 and 23 are masked in desired metallization patterns, and the remainder of the metallizations is removed, preferably by etching, forming patterned conductors 7 and 8, respectively. A recessed cavity 25 is then formed by removing, from a centrally located area, the material of the upper PWB laminate sheet 15, of bonding sheet 18, and a small thickness, e.g. up to 0.002 inches (0.005 cm) of the upper surface of heat sink 16. The removal of a small thickness of the metal of the heat sink is desirable to present a clean metal die attach surface free of bonding material and oxide. The size of recess cavity 25 is large enough to permit attachment of device 4 to heat sink 16 and yet small enough to avoid such lengths of wires 11, especially at corner positions, which could lead to collapse of the wires. An acrylic cover coat, also called "solder mask", is selectively applied to the outer surfaces of the package where subsequent Ni and Au plating of the exposed Cu metallization areas is not required. The remaining exposed Cu conductors including the wire bond pads and the Cu heat sink surface exposed in the cavity are electroplated with Ni and Au. The plating promotes wire bonding to the bonding pads and prevents oxidation of the exposed Cu surfaces.

Pins 3 are then press-fitted into the PTHs and solder-dipped. The pins are typically made of Kovar ® or phosphor bronze and are about 0.018 inches in diameter and 0.210 inches long. The pins may be arranged in any desired footprint as long as the pin field is restricted to the outside of the device attach and wire bond patterns.

This is followed by the attachment of an encapsulant retaining dam 5 to the surace of the PWB assembly adjacent to and surrounding recessed cavity 25. Thereafter, device 4 is secured onto the heat sink with a conductive adhesive. Metal particles in the adhesive, such as silver or silver-coated glass spheres, enhance heat conductance from the device to the heat sink and act as an electrically conductive connection between the device and the heat sink which may be a ground or a power plane. The device is then wire bonded and encapsulated in a suitable organic encapsulating resin, such as epoxy. An advantageous way of encapsulating the integrated circuit device in a plastic encapsulant is described in U.S. Pat. No. 4,916,522 issued on Apr. 10, 1990 to Charles Cohn, which is incorporated herein by reference. The encapsulation includes placing on an upper surface of PWB 2 an encapsulant retaining dam 5 the periphery of which is larger than the periphery of cavity 25, the dam encircling the device, portions of conductors 7, and wires 11. The volume defined by the dam and walls of opening 25 is then filled with a plastic encapsulant so as to seal the device, the wires and the enclosed portions of the metallic conductors from the ambient atmosphere. The frame is accurately positioned on the PWB by means of a plurality of retention pins which mate with a corresponding plurality of recesses in the PWB.

Figure 8:
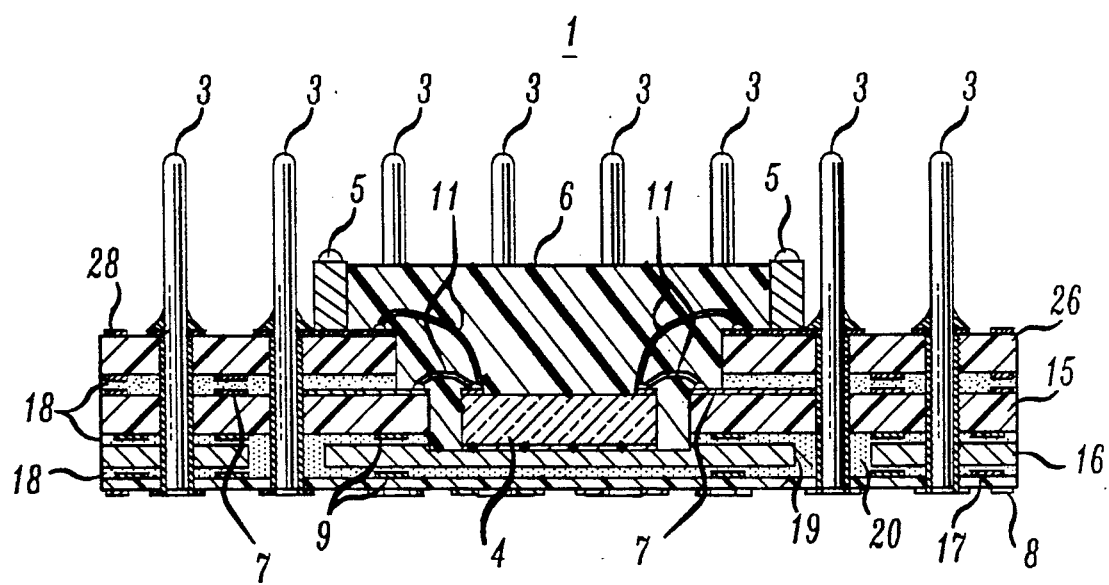
FIG. 8 is a schematic variant of FIG. 2 package depicting two wire-bonding tiers.

The package may be provided with a two tier wire-bonding arrangement, as is schematically shown in FIG. 8. In this arrangement, the main body includes another sheet, 26, of C-stage PWB material and another sheet, 18, of B-stage material, which are placed on top of sheet 15 prior to the laminating step. At that time, sheet 15 is provided with metallization pattern of conductors 7 and sheet 26 is also provided with a metallization pattern of inner conductors 9 and outer conductors 28 which are arranged to extend upon formation of PTHs between selected ones of PTHs and edges of recessed cavity 25. The recessed cavity has a stepped configuration so that end portions of conductors 7 on sheet 15 are exposed for connection to wires 11. Dam 5 encircles end portions of conductors 7 and 28. Encapsulant 6 encloses device 4, wires 11 and end portions of conductors 7 and 28.

I claim:

1. A method of producing a plastic pin grid array package comprising a planar main body member having a top and a bottom surface and a centrally disposed recessed cavity formed in the top surface, an electronic device enclosed in the recessed cavity, a metal heat sink for removal of heat from the device, and a plurality of terminal pins arranged around the recessed cavity, at least some of these pins being electrically connected to pads on said device, which comprises:

a) assembling into a laminate preassembly a plurality of coextensive sheets to be laminated into a planar main body, said preassembly including a top and a bottom sheet of C-stage synthetic organic polymer, a sheet of metal placed between the top and bottom sheets and having a higher index of thermal conductivity than the top and bottom sheets, and B-stage synthetic organic polymer sheets individually placed intermediate the metal sheet and the top and bottom sheets, said metal sheet having clearance holes at positions where it is desirable to pass certain of the terminal pins through the metal sheet without making an electrical contact with the metal sheet, b) subjecting the laminate preassembly to heat and pressure so as to form a laminated main body, the pressure forcing B-stage synthetic organic polymer into the clearance holes in the metal sheet in the form of plugs of said polymer, c) forming in the laminated main body a plurality of plated-through holes extending between the top and bottom surfaces of the main body, some of the plated-through holes being electrical contact with the metal sheet and some other of the plated-through holes passing through the plugs in the metal sheet out of contact with the metal sheet, d) forming conductors in the top and bottom surfaces of the main body, e) forming a recessed cavity in the top surface of the main body so as to expose in the cavity the surface of the metal sheet, the exposed surface of the metal sheet acting as the base of the recessed cavity, f) electroplating through a mask the exposed metal base of the cavity and portions of conductors adjacent the cavity in succession with Ni and Au, g) inserting terminal pins into the plated-through-holes and securing them by means of solder, h) adhesively securing the bottom surface of the device to the exposed metal surface in said recessed cavity, i) electrically connecting pads on the top surface of the device to the conductors on the top surface of the main body, these conductors extending between selected ones of the plated-through holes and edges of the recess cavity, and j) encapsulating the device and portions of electrical conductors connected to the pads on the device with a synthetic organic polymer.

2. The method of claim 1 in which the thickness of the bonding sheet is sufficient to electrically isolate the metal sheet from conductors on the inside surfaces of the top and bottom plastic layers and to fill the clearance holes in the metal sheet.

3. The method of claim 1 in which, prior to the assembly of component sheets into the said preassembly, the metal layer is provided with clearance holes at said selected positions.

4. The method of claim 1 in which at least some of terminal pins in those of the plated-through holes which are in electrical contact with the metal sheet are being used to enhance removal of heat from the metal sheet.

5. The method of claim 1 in which the terminal pins are secured to the plated-through holes by means of solder.

6. The method of claim 1 in which metallization conductors on the inside surfaces of the top and bottom plastic layers are electrically insulated from the heat sink by the respective bonding layers.

7. The method of claim 1 wherein the conductor pattern on the top surface of the main body comprises a series of spaced conductors extending from individual terminal pins to the recessed cavity.

8. The method of claim 1 in which the device, wires connecting the pads on the device with conductors on the top surface of the main body, and portions of conductors adjacent the recessed cavity are encapsulated in a plastic encapsulant.

9. The method of claim 8 in which said encapsulant is retained within an encapsulant retaining dam positioned on the top surface of the main body.

10. The method of claim 8 in which the encapsulant retaining dam is placed on the main body before placing the device into the recessed cavity.

11. The method of claim 1 in which said electronic device is an integrated circuit semiconductor chip.

12. The method of claim 1 in which an additional sheet of C-stage synthetic organic polymer and a sheet of B-stage synthetic polymer are placed on the top C-stage synthetic polymer to enable formation of a two-tier wire-bonding arrangement.

* * * * *